(12) United States Patent  (10) Patent No.: US 7,005,883 B2
Liao et al.  (45) Date of Patent: Feb. 28, 2006

(54) BATTERY GROUND FAULT DETECTING CIRCUIT

(75) Inventors: Jen-Chuan Liao, Taoyuan Hsien (TW); Wen-Che Tsai, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 10/944,975

(22) Filed: Sep. 20, 2004

(65) Prior Publication Data

US 2005/0151559 A1  Jul. 14, 2005

(30) Foreign Application Priority Data

Jan. 8, 2004  (TW) ............................... 93100479 A

(51) Int. Cl.
*G01R 31/36* (2006.01)
*G01N 27/416* (2006.01)
(52) U.S. Cl. .................... 324/771; 324/426; 324/158.1
(58) Field of Classification Search .................... None
See application file for complete search history.

(56) References Cited

U.S. PATENT DOCUMENTS

| | | | | |
|---|---|---|---|---|
| 2,517,575 | A * | 8/1950 | Kelly | 307/64 |
| 4,037,156 | A * | 7/1977 | Goujon et al. | 324/771 |
| 5,416,416 | A * | 5/1995 | Bisher | 324/426 |
| 5,583,440 | A * | 12/1996 | Bisher | 324/426 |
| 6,768,223 | B1 * | 7/2004 | Powell et al. | 307/64 |

2003/0030440 A1  2/2003  Yugou

FOREIGN PATENT DOCUMENTS

JP  7-146321  6/1995

* cited by examiner

*Primary Examiner*—Paresh Patel
(74) *Attorney, Agent, or Firm*—Madson & Metcalf

(57) ABSTRACT

A battery ground fault detecting circuit applied to an uninterruptible power system is disclosed. The uninterruptible power system has a controller and is connected to a battery box having a ground terminal. The battery ground fault detecting circuit is employed for detecting whether a ground fault is occurred in a battery mounted in the battery box, so that the controller can execute a corresponding protection procedure. The battery ground fault detecting circuit includes a detector electrically connected to the ground terminal of the battery box for detecting a ground current signal outputted from the ground terminal, a signal processor electrically connected to the detector for filtering and amplifying the ground current signal, a peak value comparator electrically connected to the signal processor and having a predetermined peak value for comparing the filtered and amplified ground current signal with the predetermined peak value so as to generate an AC control signal when the peak value of the ground current signal is larger than the predetermined peak value, and a signal converter electrically connected to the peak value comparator for converting the AC control signal into a DC control signal and transmitting the DC control signal to the controller for executing a corresponding protection procedure to the uninterruptible power system in response to the DC control signal.

20 Claims, 8 Drawing Sheets

BATTERY GROUND FAULT DETECTING CIRCUIT

FIELD OF THE INVENTION

The present invention relates to a battery ground fault detecting circuit, and more particular to a battery ground fault detecting circuit applied to an uninterruptible power system.

BACKGROUND OF THE INVENTION

Unstable power quality usually causes a damage, a crash or a data loss of the computer and all kinds of precision instruments, and thus, an uninterruptible power system gradually becomes an indispensable auxiliary equipment for the computer and all kinds of precision instruments. The so-called uninterruptible power system, as implied by the name, is the equipment for supplying emergency power when the external power is cut off or abnormal, and it is generally box-shaped and composed of a battery, a monitor software and a relay. Certainly, the main structure of the uninterruptible power system is the battery, whose power is saturated in peacetime. Once the uninterruptible power system detects that the external power is disconnected or the voltage is abnormal, the power source will be switched to the battery in an extremely short time, and the DC power in the battery will be converted into the AC power for loading. Therefore, through the backup battery, there will be a buffer time of several minutes, even several hours, for completing the current works and shutting off the system in accordance with a normal procedure so as to avoid data loss or system damage.

For the uninterruptible power system, the battery is an important element. In most uninterruptible power systems, there usually exists an external and independent battery box for extending the battery discharging time. However, because there is a possibility that the battery has a leakage that may cause a ground fault, or the terminal of the battery has a short fault to the ground owing to an inappropriate transportation or incorrect assembling, the battery might be damaged in a minor situation, or seriously, the battery might be burned, which causes a security problem or destroys the uninterruptible power system and thus results in the power failure.

Please refer to FIG. 1(a), which is a schematic view showing a circuit framework of a conventional uninterruptible power system. As shown in FIG. 1(a), the core elements of the uninterruptible power system include an input power source 10, a rectifier 11, a battery box 12, a battery 121 and a converter 13. When any battery 121 in the battery set contacts with the battery box 12 due to a leakage thereof, a current loop will be formed between the battery and the ground because the case of the battery box 12 has been equipment grounded. Therefore, a spark and overheat might be occurred at the leakage, so that the case of the battery 121 might be overheated and burned. Although the battery 121 can be positioned in a specially made insulation box for avoiding the leakage from contacting with the case, it is still undependable.

Regarding the ground fault problem of the battery 121 in the battery box 12, JP patent application No. 7-146321 published on Jun. 6, 1995 proposed a protecting manner that a leakage breaker 14 is mounted between the input power source 10 and the rectifier 11 so that when the detector 15 detects an abnormal input power source, it will generate a signal to trigger the leakage breaker 14, as shown in FIG. 1(b). However, because the sensitivity of the ground leakage breaker 14 is still a problem, there is a possibility that an unusual or abnormal error might not be detected by this manner, and further, the cost thereof is higher.

Another battery ground fault detecting method is disclosed in U.S. patent publication No. U.S. 2003/0030440A1 published on Feb. 13, 2003, which employs a voltage dividing resistor for detecting whether a ground fault is occurred or not. As shown in FIG. 1(c), when a ground fault is occurred in the battery 121, the detector 15 will send a signal to the microcontroller 17 of the uninterruptible power system in response to the abnormal voltage of the resistor 16, so that the microcontroller 17 may alert the system or execute a procedure properly. However, because there exists impedance in the electrolyte when the leakage ground fault is occurred in the battery 121, this method still cannot detect the battery ground fault ranged in a middle magnitude owing to the precision problem.

Please refer to FIG. 1(d), the detecting method illustrated therein employs an isolation transformer 18 added at the input terminal of the input power source 10 for avoiding a formation of current loop caused by a ground fault of the battery 121. However, because the capacity of this isolation transformer 18 has to be identical to that of the uninterruptible power system, the cost and installation space must be increased. Therefore, in the viewpoint of cost-benefit, this detecting method is not a best processing way.

According to the above descriptions, it is obvious that the application of the uninterruptible power system is focused on improving the reliability of power supply, and thus, the uninterruptible power system should own the ability of detecting all kinds of faults and executing a corresponding procedure properly. Certainly, the existence of undetectable fault will reduce the reliability of the uninterruptible power system. Therefore, it is desired to develop a detecting circuit that can overcome the defects in the prior arts and detect the battery ground fault immediately.

SUMMARY OF THE INVENTION

The object of the present invention is to provide a battery ground fault detecting circuit applied to an uninterruptible power system for solving defects, for example, the unreliable, expensive or insensitive problems etc., in the conventional battery ground fault detecting circuits.

In accordance with one aspect of the present invention, a battery ground fault detecting circuit applied to an uninterruptible power system is provided. The uninterruptible power system has a controller and is connected to a battery box having a ground terminal. The battery ground fault detecting circuit is employed for detecting whether a ground fault is occurred in a battery mounted in the battery box so that the controller executes a corresponding protection procedure thereupon. The battery ground fault detecting circuit includes a detector electrically connected to the ground terminal of the battery box for detecting a ground current signal outputted from the ground terminal, a signal processor electrically connected to the detector for filtering and amplifying the ground current signal, a peak value comparator electrically connected to the signal processor and having a predetermined peak value for comparing the filtered and amplified ground current signal with the predetermined peak value so as to generate an AC control signal when the peak value of the ground current signal is larger than the predetermined peak value, and a signal converter electrically connected to the peak value comparator for converting the AC control signal into a DC control signal and transmitting the DC control signal to the controller for executing the corresponding protection procedure to the uninterruptible power system in response to the DC control signal.

In an embodiment, the detector is a current detector (HALL CT) for detecting the ground current signal through the ground terminal, the signal processor is an amplifier (OPA) for filtering and amplifying the ground current signal, and the peak value comparator includes two amplifiers, one of which is for a comparison of a positive peak value and the other is for a comparison of a negative peak value.

For example, the AC control signal is a square wave control signal.

Furthermore, the signal converter includes an integration circuit and a comparator, and the AC control signal is integrated by the integration circuit and then compared by the comparator so as to generate the DC control signal. In an embodiment, the integration circuit is a resistor-capacitor (RC) integration circuit for integrating the AC control signal, and the comparator is an amplifier (OPA) for a comparison of the integrated AC control signal so as to generate the DC control signal.

In addition, the battery ground fault detecting circuit can be mounted inside the battery box and communicates with the controller through a transmission line, and alternatively, the battery ground fault detecting circuit can be mounted inside the uninterruptible power system.

In an embodiment, the controller is a microcontroller (MCU) for executing the corresponding protection procedure when the ground fault is occurred in the battery mounted in the battery box.

Preferably, the battery box has plural batteries mounted therein.

In accordance with another aspect of the present invention, an uninterruptible power system is provided. The uninterruptible power system includes a controller, a battery box having a ground terminal, and a battery ground fault detecting circuit electrically connected to the controller and the battery box for detecting whether a ground fault is occurred in a battery mounted in the battery box so that the controller executes a corresponding protection procedure. The battery ground fault circuit includes a detector electrically connected to the ground terminal of the battery box for detecting a ground current signal outputted from the ground terminal, a signal processor electrically connected to the detector for filtering and amplifying the ground current signal, a peak value comparator electrically connected to the signal processor and having a predetermined peak value for comparing the filtered and amplified ground current signal with the predetermined peak value so as to generate an AC control signal when the peak value of the ground current signal is larger than the predetermined peak value, and a signal converter electrically connected to the peak value comparator for converting the AC control signal into a DC control signal and transmitting the DC control signal to the controller for executing the corresponding protection procedure to the uninterruptible power system in response to the DC control signal.

In an embodiment, the battery ground fault detecting circuit is mounted inside the battery box and communicates with the controller through a transmission line.

Alternatively, the battery ground fault detecting circuit is mounted inside the uninterruptible power system.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The present invention relates to a battery ground fault detecting circuit which is applied to an uninterruptible power system. The battery ground fault detecting circuit according to the present invention employs a current detector for detecting a ground current signal of a battery box, and a peak value comparator for comparison so as to decide whether the battery has a ground fault. And, the ground fault occurred in any battery box can be detected so that the unreliable, expensive or insensitive problems in the conventional battery ground fault detecting circuits can be solved.

Figure 1A:
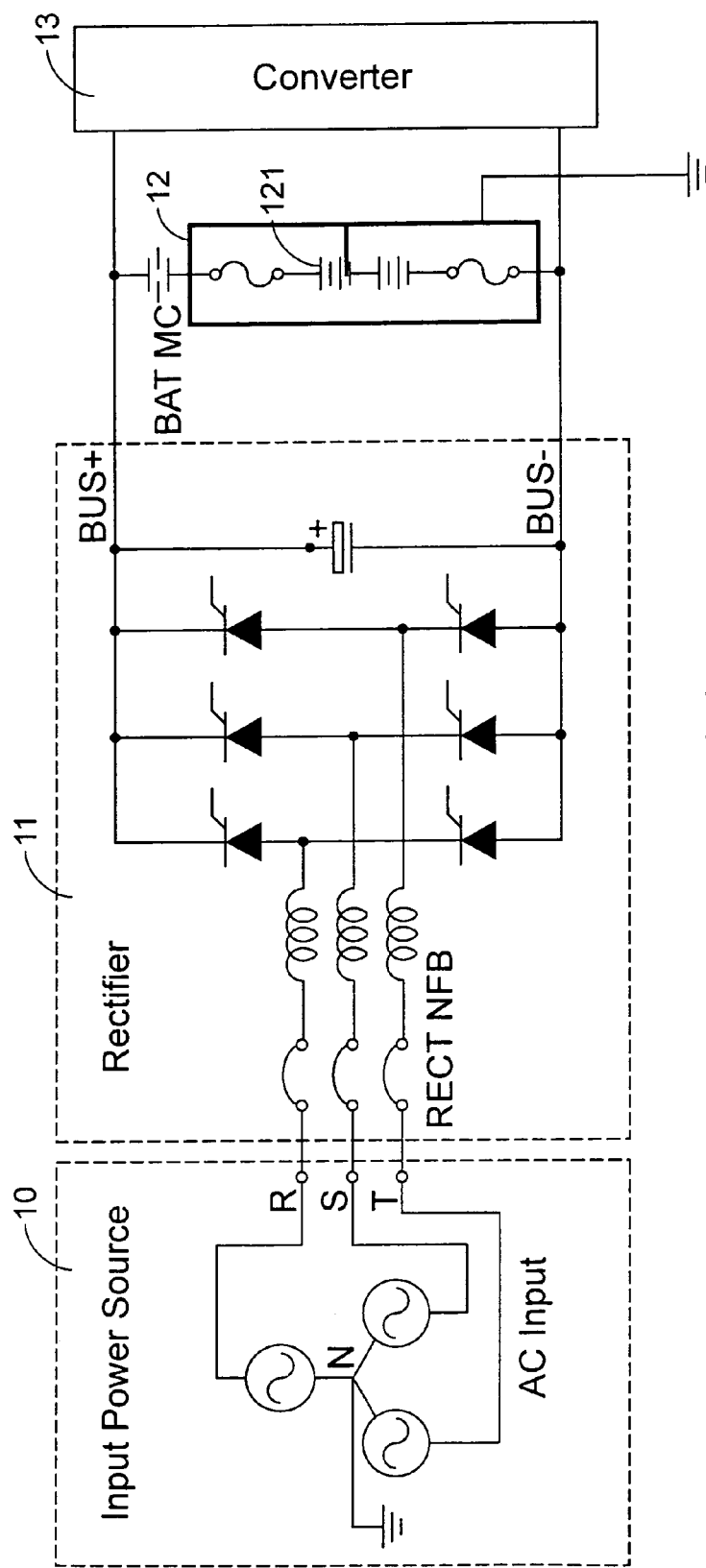
FIG. 1(a) is a schematic view showing a circuit framework of a conventional uninterruptible power system.
Figure 1B:
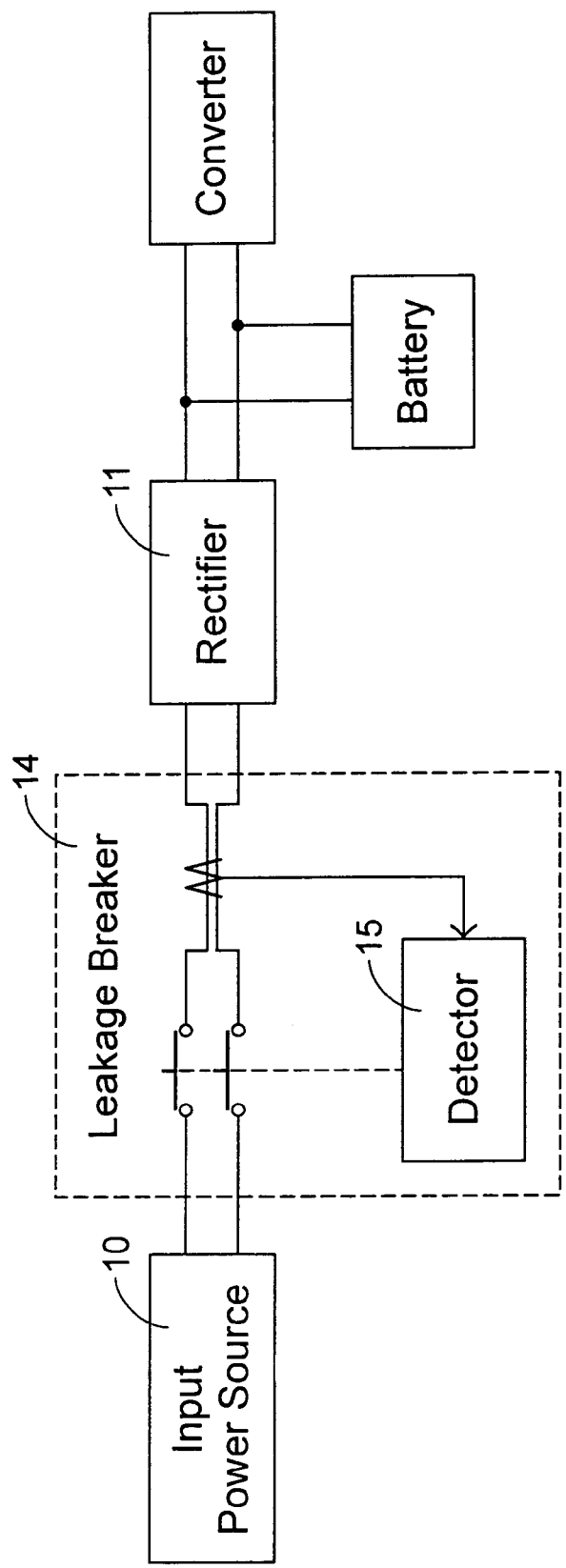
FIG. 1(b) is a schematic view showing a circuit framework which employs a leakage breaker for detecting a battery ground fault according to a prior art.
Figure 1C:
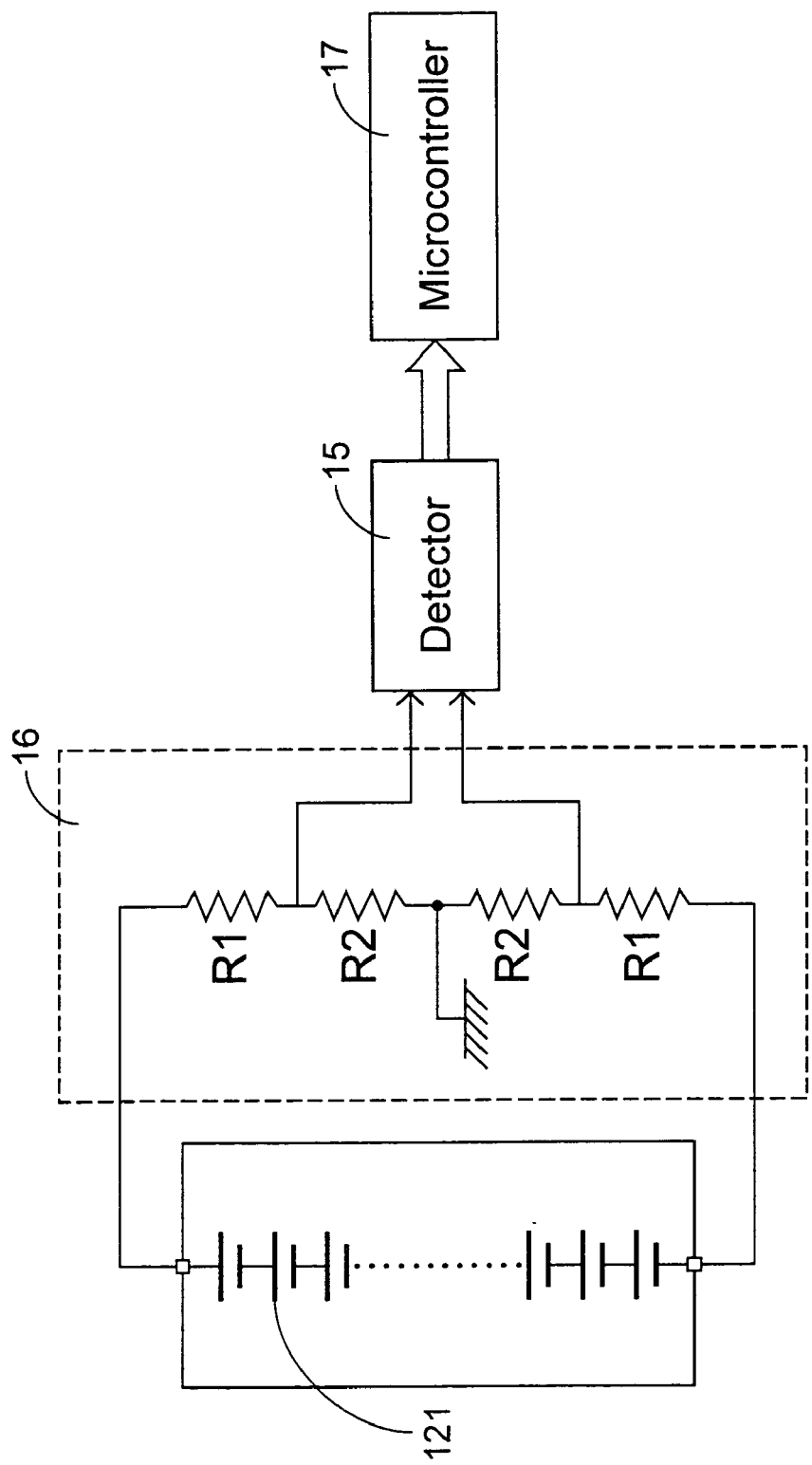
FIG. 1(c) is a schematic view showing a circuit framework which employs a voltage dividing resistor for detecting a battery ground fault according to a prior art.
Figure 1D:
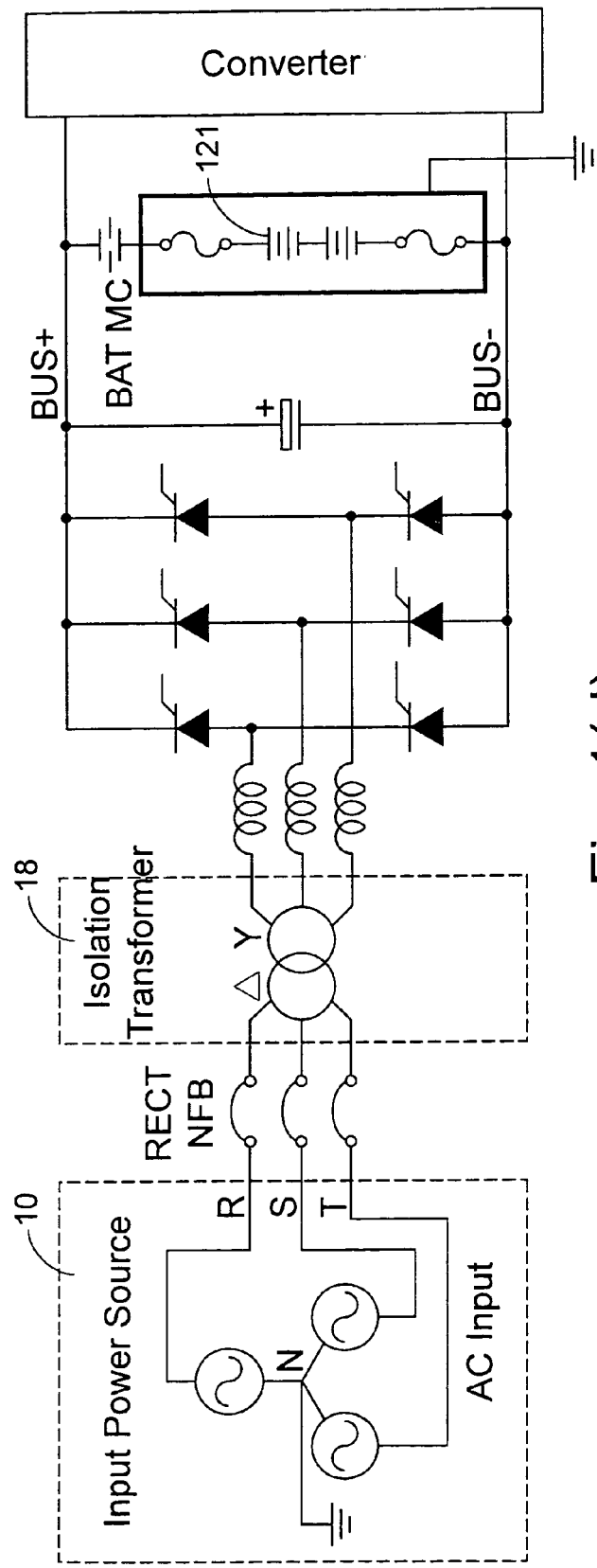
FIG. 1(d) is a schematic view showing a circuit framework which employs an isolation transformer for detecting a battery ground fault according to a prior art.
Figure 2:
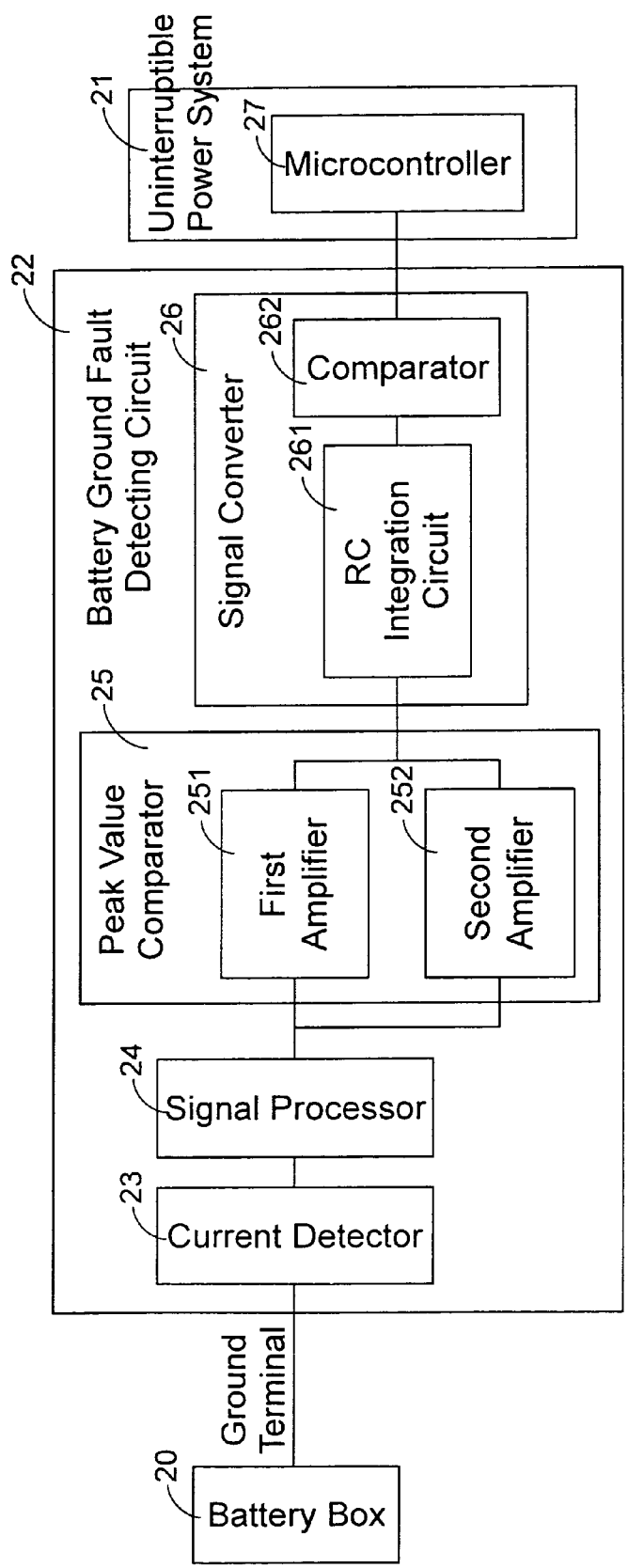
FIG. 2 is a schematic view showing a circuit block of a battery ground fault detecting circuit according to the present invention.

Please refer to FIG. 2 which is a schematic view showing a circuit block of a battery ground fault detecting circuit according to a preferred embodiment of the present invention. As shown in FIG. 2, one terminal of the battery ground fault detecting circuit 22 is electrically connected to the ground terminal of a battery box 20, and the other terminal thereof is connected to a controller of an uninterruptible power system 21, wherein the controller is a microcontroller (MCU) 27. The battery ground fault detecting circuit 22 is mainly employed to detect a ground current signal of the battery box 20, and thus, when a battery ground fault is detected, a signal will be transmitted to the microcontroller 27 of the uninterruptible power system 21. Then, the microcontroller 27 will send a warning signal and close a rectifier (not shown) or turn off a switch of the battery for disconnecting a leakage current loop so that a more serious event can be prevented and an operation reliability of the uninterruptible power system can also be improved.

The core elements of the battery ground fault detecting circuit 22 include a detector, a signal processor 24, a peak value comparator 25 and a signal converter 26; wherein the detector is a current detector 23 (HALL CT) for detecting a ground current signal outputted from the ground terminal of the battery box 20. The signal processor 24 is an amplifier (OPA) for filtering and amplifying a ground current signal detected by the current detector 23.

In addition, the peak value comparator 25 is electrically connected to the signal processor 24 and mainly comprises two amplifiers, wherein a first amplifier 251 is responsible for a comparison of a positive peak value and a second amplifier 252 is responsible for a comparison of a negative peak value. The first amplifier 251 and the second amplifier 252 both have a predetermined peak value for comparing the filtered and amplified ground current signal with respective predetermined peak values so as to generate an AC control signal of a ground fault when the peak value of the ground current signal is larger than the predetermined peak value.

The signal converter 26 comprises an RC integration circuit (resistor-capacitor integration circuit) 261 and a comparator 262. Because the ground current signal is an AC signal, the generated ground fault control signal is a square wave signal, and for avoiding a detection error of the microcontroller 27 caused by a noise interference, the ground current signal has to be integrated by the RC integration circuit 261 firstly and then be compared by the comparator 262 for generating a DC control signal. Next, the DC control signal is transmitted to the microcontroller 27 of the uninterruptible power system 21 so that the microcontroller 27 can send a warning signal in response to a trigger of the DC control signal and then close the rectifier or turn off the switch of the battery for avoiding a more serious problem and also improving the operation reliability of the uninterruptible power system.

Figure 3:
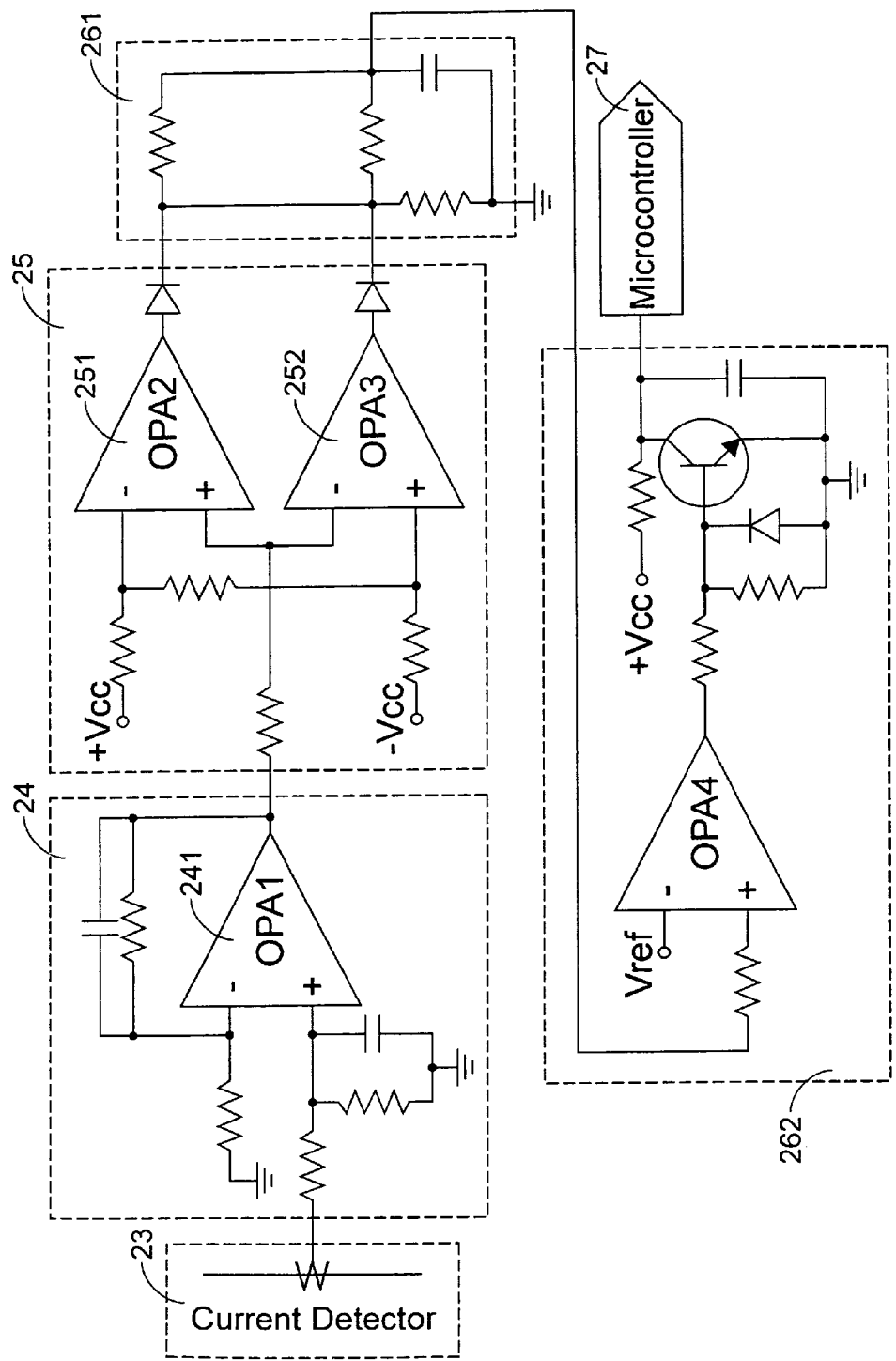
FIG. 3 is a circuit diagram showing a battery ground fault detecting circuit according to the present invention.

Please refer to FIG. 3, which is a circuit diagram of a battery ground fault detecting circuit according to the present invention. As shown in FIG. 3, the signal processor 24 includes an amplifier (OPA1) 241 for filtering and amplifying the ground current signal detected by the current detector 23, and then, the filtered and amplified ground current signal will be compared respectively with a predetermined positive peak value and a predetermined negative peak value by the first amplifier (OPA2) 251 and the second amplifier (OPA3) 252 of the peak value comparator 25. Therefore, when a ground fault is occurred, a ground fault control signal will be generated. Subsequently, after the ground fault control signal is processed by the RC integration circuit 261 and then compared by the comparator (OPA4) 262, the DC control signal will be generated. Finally, the DC control signal is transmitted to the microcontroller 27 of the uninterruptible power system 21 so that the microcontroller can execute corresponding protection procedure.

Figure 4A:
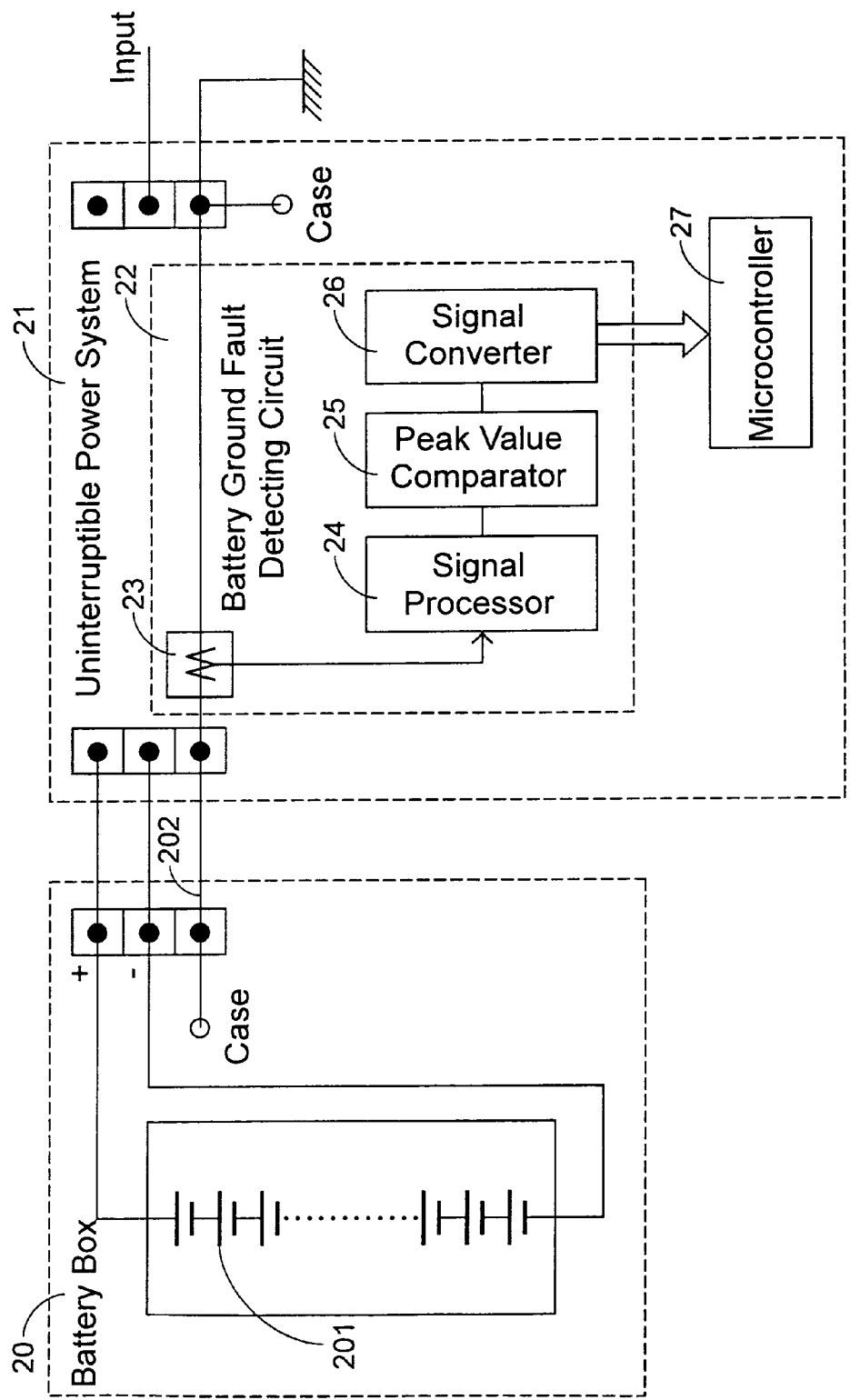
FIG. 4(a) is a schematic view showing a framework of a battery ground fault detecting circuit mounted in an uninterruptible power system according to the present invention.

In some embodiments, the battery ground fault detecting circuit 22 can be mounted inside a battery box or an uninterruptible power system for detecting the ground current signal. Please refer to FIG. 4(a), which illustrates the situation that the battery ground fault detecting circuit 22 is mounted inside the uninterruptible power system 21. The battery box 20 is made of metal, and a ground terminal of the case of the battery box 20 is connected to the uninterruptible power system 21 through a ground wire 202, and in the uninterruptible power system 21, the ground wire 202 firstly passes through the current detector 23 and then arrives the ground terminal. When a ground fault of the battery 201 is occurred, a current signal will pass through the ground wire 202 and be detected by the current detector 23 and then transmitted to the signal processor 24 and the peak value comparator 25. After the peak value comparator 25 detects the fault, a DC control signal will be transmitted to the microcontroller 27 so that the microcontroller 27 can control the protection procedure.

Figure 4B:
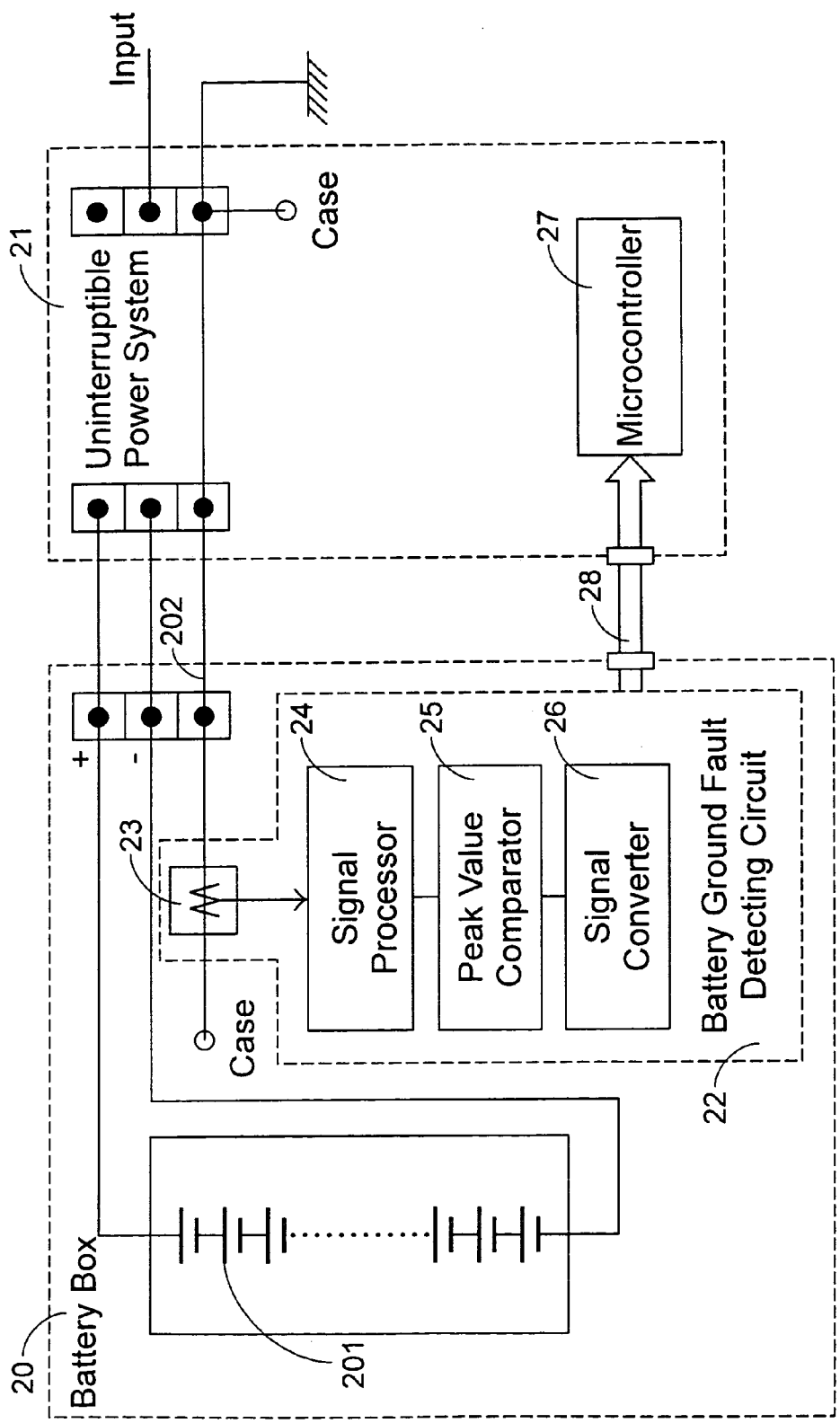
FIG. 4(b) is a schematic view showing a framework of a battery ground fault detecting circuit mounted in a battery box according to the present invention.

Please refer to FIG. 4(b), which illustrates the situation that the battery ground fault detecting circuit 22 is mounted inside the battery box 20. The ground wire 202 of the battery box 20 firstly passes through the current detector 23 and then arrives at the ground terminal. In this case, the ground terminal might be directly connected to the earth through the ground wire, or be firstly connected to the ground terminal of the uninterruptible power system 21 through the ground wire and then to the earth. When a ground fault of the battery 201 is occurred, a fault signal will be transmitted to the microcontroller 27 of the uninterruptible power system 21 through a transmission line 28 after the fault is detected by the battery ground fault detecting circuit 22, and then the microcontroller 27 can control the protection procedure. In which, the transmission line 28 is a transmission line having a standard of RS232 or RS485.

In view of the aforesaid, the battery ground fault detecting circuit according to the present invention utilizes a current detector for detecting a ground current signal of a battery box so as to achieve a purpose of battery ground fault detection. Furthermore, through the design according to the present invention, the ground fault occurred in any battery box can be immediately detected. In addition, since a signal converter is included in the battery ground fault detecting circuit of the present invention for converting an AC control signal into a DC control signal, the detection error of the microcontroller caused by the noise interference can be avoided.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A battery ground fault detecting circuit applied to an uninterruptible power system having a controller and being connected to a battery box having a ground terminal, wherein said battery ground fault detecting circuit is employed for detecting whether a ground fault is occurred in a battery mounted in said battery box so that said controller executes a corresponding protection procedure thereupon, comprising:

a detector electrically connected to said ground terminal of said battery box for detecting a ground current signal outputted from said ground terminal;

a signal processor electrically connected to said detector for filtering and amplifying said ground current signal;

a peak value comparator electrically connected to said signal processor and having a predetermined peak value for comparing said filtered and amplified ground current signal with said predetermined peak value so as to generate an AC control signal when said peak value of said ground current signal is larger than said predetermined peak value; and a signal converter electrically connected to said peak value comparator for converting said AC control signal into a DC control signal and transmitting said DC control signal to said controller for executing said corresponding protection procedure to said uninterruptible power system in response to said DC control signal.

2. The battery ground fault detecting circuit according to claim 1, wherein said detector is a current detector (HALL CT) for detecting said ground current signal from said ground terminal.

3. The battery ground fault detecting circuit according to claim 1, wherein said signal processor is an amplifier (OPA) for filtering and amplifying said ground current signal.

4. The battery ground fault detecting circuit according to claim 1, wherein said peak value comparator comprises two amplifiers, one of which is for a comparison of a positive peak value and the other is for a comparison of a negative peak value.

5. The battery ground fault detecting circuit according to claim 1, wherein said AC control signal is a square wave control signal.

6. The battery ground fault detecting circuit according to claim 1, wherein said signal converter comprises an integration circuit and a comparator, and said AC control signal is integrated by said integration circuit and then compared by said comparator so as to generate said DC control signal.

7. The battery ground fault detecting circuit according to claim 6, wherein said integration circuit is a resistor-capacitor (RC) integration circuit for integrating said AC control signal.

8. The battery ground fault detecting circuit according to claim 6, wherein said comparator is an amplifier (OPA) for a comparison of said integrated AC control signal so as to generate said DC control signal.

9. The battery ground fault detecting circuit according to claim 1, wherein said battery ground fault detecting circuit is mounted inside said battery box and communicates with said controller through a transmission line.

10. The battery ground fault detecting circuit according to claim 1, wherein said battery ground fault detecting circuit is mounted inside said uninterruptible power system.

11. The battery ground fault detecting circuit according to claim 1, wherein said controller is a microcontroller (MCU) for executing said corresponding protection procedure when said ground fault is occurred in said battery mounted in said battery box.

12. The battery ground fault detecting circuit according to claim 1, wherein said battery box has plural batteries mounted therein.

13. An uninterruptible power system, comprising:
a controller;
a battery box having a ground terminal; and
a battery ground fault detecting circuit electrically connected to said controller and said battery box for detecting whether a ground fault is occurred in a battery mounted in said battery box so that said controller executes a corresponding protection procedure, said battery ground fault detecting circuit comprising:

a detector electrically connected to said ground terminal of said battery box for detecting a ground current signal outputted from said ground terminal;
a signal processor electrically connected to said detector for filtering and amplifying said ground current signal;
a peak value comparator electrically connected to said signal processor and having a predetermined peak value for comparing said filtered and amplified ground current signal with said predetermined peak value so as to generate an AC control signal when said peak value of said ground current signal is larger than said predetermined peak value; and
a signal converter electrically connected to said peak value comparator for converting said AC control signal into a DC control signal and transmitting said DC control signal to said controller for executing said corresponding protection procedure to said uninterruptible power system in response to said DC control signal.

14. The uninterruptible power system according to claim 13, wherein said controller is a microcontroller (MCU) for executing said corresponding protection procedure to said uninterruptible power system when said ground fault is occurred in said battery mounted in said battery box.

15. The uninterruptible power system according to claim 13, wherein said detector is a current detector (HALL CT) for detecting said ground current signal from said ground terminal, said signal processor is an amplifier (OPA) for filtering and amplifying said ground current signal, and said peak value comparator comprises two amplifiers, one of which is for a comparison of a positive peak value and the other is for a comparison of a negative peak value.

16. The uninterruptible power system according to claim 13, wherein said signal converter comprises an integration circuit and a comparator, and said AC control signal is integrated by said integration circuit and then compared by said comparator so as to generate said DC control signal.

17. The uninterruptible power system according to claim 16, wherein said integration circuit is a resistor-capacitor (RC) integration circuit for integrating said AC control signal.

18. The uninterruptible power system according to claim 16, wherein said comparator is an amplifier (OPA) for a comparison of said integrated AC control signal so as to generate said DC control signal.

19. The uninterruptible power system according to claim 13, wherein said battery ground fault detecting circuit is mounted inside said battery box and communicates with said controller through a transmission line.

20. The uninterruptible power system according to claim 13, wherein said battery ground fault detecting circuit is mounted inside said uninterruptible power system.

* * * * *